(12) United States Patent
Lee et al.

(10) Patent No.: US 9,425,745 B2
(45) Date of Patent: Aug. 23, 2016

(54) BUFFER CIRCUIT CAPABLE OF IMPROVING AMPLIFICATION PERFORMANCE

(71) Applicant: SK hynix Inc., Icheon-si Gyeonggi-do (KR)

(72) Inventors: Dong Heon Lee, Icheon-si (KR); Jin Ha Hwang, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 36 days.

(21) Appl. No.: 14/666,414

(22) Filed: Mar. 24, 2015

(65) Prior Publication Data

US 2016/0164465 A1    Jun. 9, 2016

(30) Foreign Application Priority Data

Dec. 5, 2014    (KR) .................. 10-2014-0174450

(51) Int. Cl.
| | | |
|---|---|---|
| *H03F 3/45* | (2006.01) | |
| *H03F 1/02* | (2006.01) | |
| *H03F 3/16* | (2006.01) | |

(52) U.S. Cl.
CPC .............. *H03F 1/0205* (2013.01); *H03F 3/16* (2013.01); *H03F 2200/555* (2013.01)

(58) Field of Classification Search
USPC ......................................... 330/250, 253, 257
IPC .......................................................... H03F 3/45
See application file for complete search history.

(56) References Cited

U.S. PATENT DOCUMENTS

| | | | | |
|---|---|---|---|---|
| 5,276,665 A | * | 1/1994 | Aoki ...................... | G11B 7/005 369/47.22 |
| 5,659,517 A | * | 8/1997 | Arimoto .................. | G11C 5/14 365/226 |
| 5,875,049 A | * | 2/1999 | Asano ...................... | H03F 3/08 250/214 A |
| 6,041,012 A | * | 3/2000 | Banba .................... | G11O 5/143 365/185.18 |
| 6,433,769 B1 | * | 8/2002 | Cato ........................ | G09G 3/36 345/101 |
| 7,724,088 B2 | * | 5/2010 | Adachi ................... | H03F 1/308 330/255 |
| 8,036,049 B2 | | 10/2011 | Park | |
| 2007/0024368 A1 | * | 2/2007 | Abdelatty Ali ..... | H03F 3/45188 330/259 |
| 2007/0164809 A1 | * | 7/2007 | Fukuda .................... | G05F 3/30 327/539 |

FOREIGN PATENT DOCUMENTS

KR    1020060053432 A    5/2006

\* cited by examiner

*Primary Examiner* — Patricia T Nguyen
(74) *Attorney, Agent, or Firm* — William Park & Associates Ltd.

(57) ABSTRACT

A buffer circuit may include an amplification reference voltage generation unit and an amplification unit. The amplification reference voltage generation unit may generate an amplification reference voltage. The amplification reference voltage generation unit configured to change a level of the amplification reference voltage based on a level of an output signal. The amplification unit may generate the output signal by differentially amplifying an input signal and the amplification reference voltage.

20 Claims, 5 Drawing Sheets

BUFFER CIRCUIT CAPABLE OF IMPROVING AMPLIFICATION PERFORMANCE

CROSS-REFERENCES TO RELATED APPLICATION

The present application claims priority under 35 U.S.C. §119(a) to Korean application number 10-2014-0174450, filed on Dec. 5, 2015, in the Korean Intellectual Property Office, which is incorporated herein by reference in its entirety.

BACKGROUND

1. Technical Field

Various embodiments generally relate to a semiconductor device, and more particularly, to a buffer circuit for amplifying an input signal.

2. Related Art

A buffer circuit refers to a circuit configured for sensing and amplifying input signals and generating output signals. An electronic device including a semiconductor device can be operated while transmitting and receiving signals between internal components or external components. The transmission and reception of signals may be more precisely performed through a buffer circuit. The buffer circuit can repeat a signal or convert a signal with a small swing into a signal with a large swing.

With the improvement in integration and power consumption of electronic devices, the level of a power supply voltage used in the electronic devices has continuously decreased. When the level of the power supply voltage decreases, the swing of a signal transmitted between internal components of an electronic device or between an external component and the electronic device also decreases. Thus, the waveform of the signal may become sensitive to a process, voltage, or temperature variations, and signal distortion may occur more easily. Therefore, for accurate signal transmission and reception to occur for a circuit, the operational stability of the buffer circuit is one of the most important factors.

A generally used buffer circuit is a differential amplifier buffer circuit. The differential amplifier buffer circuit may compare an input signal to a reference signal, and amplify a voltage level difference between the input signal and the reference signal. Since the differential amplifier buffer circuit amplifies a voltage difference between the input signal and the reference signal, a voltage difference between the input signal and the reference signal becomes an important factor for determining a gain and amplification speed of the buffer circuit.

SUMMARY

In an embodiment, a buffer circuit may include an amplification reference voltage generation unit configured to receive an output signal and generate an amplification reference voltage. The amplification reference voltage generation unit configured to change a level of the amplification reference voltage based on a level of the output signal. The buffer circuit may include an amplification unit configured to generate the output signal by differentially amplifying an input signal and the amplification reference voltage.

In an embodiment, a buffer circuit may include an amplification reference voltage generation unit configured to generate a first reference voltage having a fixed level and a second reference voltage having a variable level changing according to a level of an output signal. The buffer circuit may include a first input unit configured to receive an input signal and form a current path between a power supply voltage and a ground voltage. The buffer circuit may include a second input unit configured to receive the first and second reference voltages and form a current path between the power supply voltage and the ground voltage, and coupled to an output node.

In an embodiment, a buffer circuit may include an amplification reference voltage generation unit configured to receive an output signal and generate an amplification reference voltage. The amplification reference voltage generation unit configured to change a level of the amplification reference voltage based on a level of the output signal. The buffer circuit may include a first amplification stage configured to generate a first amplified signal pair by differentially amplifying an input signal and the amplification reference voltage. The buffer circuit may include a second amplification stage configured to generate the output signal by differentially amplifying the first amplified signal pair.

DETAILED DESCRIPTION

Hereinafter, a buffer circuit according to the present disclosure will be described below with reference to the accompanying drawings through various examples of embodiments.

Various embodiments may be directed to a buffer circuit capable of differentially amplifying input signals using a reference voltage. The reference voltage may change according to an output signal of the buffer circuit.

Figure 1:
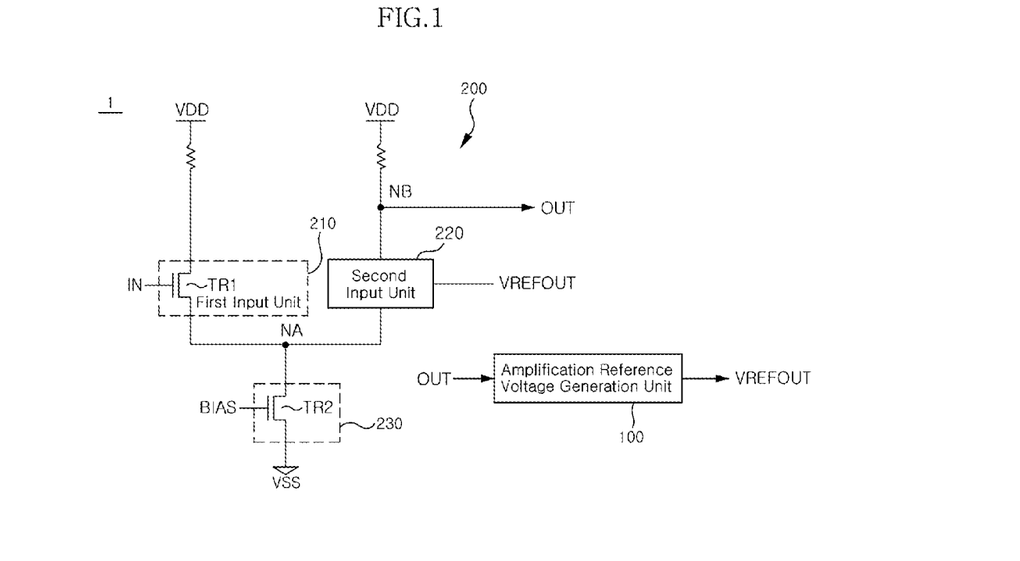
FIG. 1 is a diagram illustrating a representation of an example of the configuration of a buffer circuit according to an embodiment.

Referring to FIG. 1, a buffer circuit 1 according to an embodiment may include an amplification reference voltage generation unit 100 and an amplification unit 200. The amplification reference voltage generation unit 100 may receive an output signal OUT. The amplification reference voltage generation unit 100 may generate an amplification reference voltage VREFOUT. The amplification reference voltage generation unit 100 may generate the amplification reference voltage VREFOUT having a level. The level of the amplification reference voltage VREFOUT, generated by the amplification reference voltage generation unit 100, may change according to the level of the output signal OUT. For example, when the output signal OUT has a high level, the amplification reference voltage generation unit 100 may generate the amplification reference voltage VREFOUT having a higher voltage level. For example, when the output signal OUT has a low level, the amplification reference voltage generation unit 100 may generate the amplification reference voltage VREFOUT having a lower voltage level.

The amplification unit 200 may receive an input signal IN and the amplification reference voltage VREFOUT. The amplification unit 200 may generate the output signal OUT. The amplification unit 200 may generate the output signal OUT by differentially amplifying the input signal IN and the amplification reference voltage VREFOUT. The amplification unit 200 may compare the level of the input signal IN to the level of the amplification reference voltage VREFOUT, and may determine the level of the output signal OUT according to the comparison result. For example, the amplification unit 200 may generate the output signal OUT having a high level when the input signal IN has a higher level than the amplification reference voltage VREFOUT. For example, the amplification unit 200 may generate the output signal OUT having a low level when the input signal IN has a lower level than the amplification reference voltage VREFOUT.

Referring to FIG. 1, the amplification unit 200 may include a first input unit 210 and a second input unit 220. The first input unit 210 may receive the input signal IN, and form a current path between a power supply voltage VDD and a ground voltage VSS in response to the input signal IN. The second input unit 220 may receive the amplification reference voltage VREFOUT, and form a current path between the power supply voltage VDD and the ground voltage VSS in response to the amplification reference voltage VREFOUT.

The amplification unit 200 may further include an enable unit 230. The enable unit 230 may receive a bias signal BIAS. The Bias signal BIAS may be used by the enable unit 230 to enable the amplification unit 200. The bias signal BIAS may have an arbitrary voltage level. For example, the bias signal BIAS may have a voltage level corresponding to the power supply voltage VDD. The enable unit 230 may form a current path of the amplification unit 200 to enable the amplification unit 200. The enable unit 230 may be coupled to the first and second input units 210 and 220. The enable unit 230 may form a current path between the first and second input units 210 and 220 and the ground voltage VSS.

Referring to FIG. 1, the first input unit 210 may include a first transistor TR1. The first transistor TR1 may have a gate configured to receive the input signal IN. The first transistor TR1 may have a drain coupled to the power supply voltage VDD through a resistor (i.e., see FIG. 1). The first transistor TR1 may have a source coupled to a node NA. The first transistor TR1 may form a current path between the power supply voltage VDD and the node NA in response to the input signal IN. As the voltage level of the input signal IN increases, the first transistor TR1 may form a current path through which a larger amount of current can flow. The enable unit 230 may include a second transistor TR2. The second transistor TR2 may have a gate configured to receive the bias signal BIAS. The second transistor TR2 may have a drain coupled to the node NA. The second transistor TR2 may have a source coupled to the ground voltage VSS. The second transistor TR2 may be turned on in response to the bias signal BIAS, and may form a current path between the node NA and the ground voltage VSS.

Figure 2:
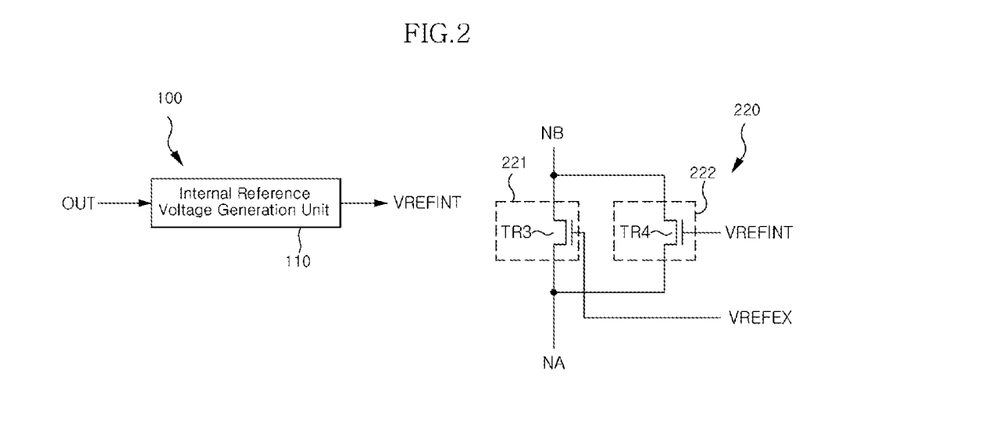
FIG. 2 is a diagram illustrating a representation of an example of the configuration of a second input unit and an amplification reference voltage generation unit illustrated in FIG. 1.

FIG. 2 is a diagram illustrating a representation of an example of the configuration of the second input unit 220 and the amplification reference voltage generation unit 100 illustrated in FIG. 1. Referring to FIGS. 1 and 2, the amplification reference voltage VREFOUT may include first and second reference voltages VREFEX and VREFINT. The first reference voltage VREFEX may have a fixed level, regardless of the level of the output signal OUT. The second reference voltage VREFINT may have a level. The level of the second reference voltage VREFINT may change according to the level of the output signal OUT. The first reference voltage VREFEX may include an external reference voltage received from outside a semiconductor device having the buffer circuit 1 provided therein. The amplification reference voltage generation unit 100 may receive the external reference voltage, and provide the received voltage as the first reference voltage VREFEX. The amplification reference voltage generation unit 100 may include an internal reference voltage generation unit 110. The internal reference voltage generation unit 110 may receive the output signal OUT. The internal reference voltage generation unit 110 may generate the second reference voltage VREFINT. The internal reference voltage generation unit 110 may generate the second reference voltage VREFINT having a voltage level. The voltage level of the second reference voltage VREFINT may change according to the level of the output signal OUT. For example, when the output signal OUT has a high level, the internal reference voltage generation unit 110 may generate the second reference voltage VREFINT having a higher level. For example, when the output signal OUT has a low level, the internal reference voltage generation unit 110 may generate the second reference voltage VREFINT having a lower level. The internal reference voltage generation unit 110 may change the level of the second reference voltage VREFINT to three different voltage levels in response to the output signal OUT. For example, the internal reference voltage generation unit 110 may provide a normal voltage as the second reference voltage VREFINT, in a high impedance state where the output signal OUT is not generated. For example, when the output signal OUT has a high level, the internal reference voltage generation unit 110 may provide an up voltage having a higher level than the normal voltage as the second reference voltage VREFINT. For example, when the output signal OUT has a low level, the internal reference voltage generation unit 110 may provide a down voltage having a lower level than the normal voltage as the second reference voltage VREFINT.

The second input unit 220 may receive the first and second reference voltages VREFEX and VREFINT. The second input unit 220 may form a current path in response to the first and second reference voltages VREFEX and VREFINT. The second input unit 220 may include a first current path formation unit 221 and a second current path formation unit 222. The first current path formation unit 221 may form a current path between an output node NB and the node NA in response to the first reference voltage VREFEX. The second current path formation unit 222 may form a current path between the output node NB and the node NA in response to the second reference voltage VREFINT.

The first current path formation unit 221 may include a third transistor TR3. The third transistor TR3 may have a gate configured to receive the first reference voltage VREFEX. The third transistor TR3 may have a drain coupled to the output node NB. The third transistor TR3 may have a source coupled to the node NA. The third transistor TR3 may form a current path between the output node NB and the node NA in response to the first reference voltage VREFEX. The second current path formation unit 222 may include a fourth transistor TR4. The fourth transistor TR4 may have a gate configured to receive the second reference voltage VREFINT. The fourth transistor TR4 may have a drain coupled to the output node NB. The fourth transistor TR4 may have a source coupled to the node NA. The fourth transistor TR4 may form a current path between the output node NB and the node NA in response to the second reference voltage VREFINT. As the level of the second reference voltage VREFINT increases, the fourth transistor TR4 may form a current path through which a larger amount of current can flow.

Figure 3:
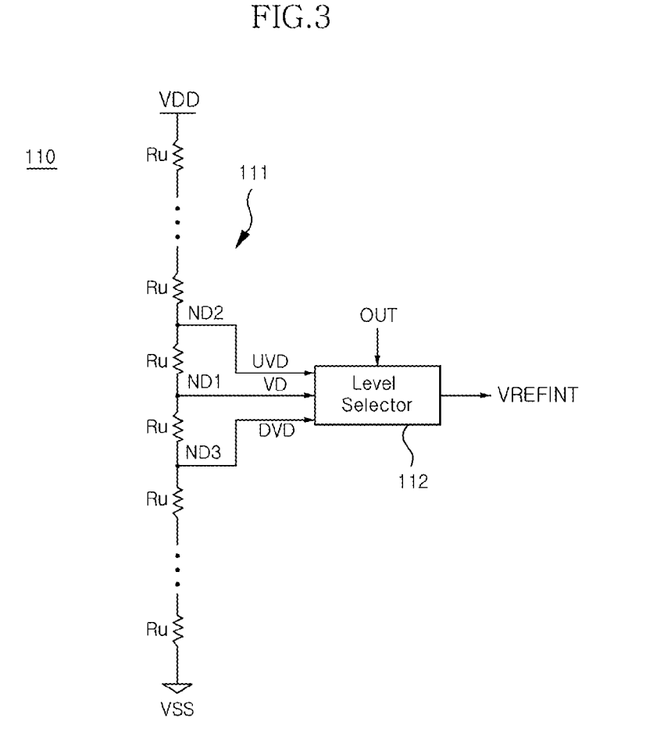
FIG. 3 is a diagram illustrating a representation of an example of the configuration of an internal reference voltage generation unit illustrated in FIG. 2.

FIG. 3 is a diagram illustrating a representation of an example of the configuration of the internal reference voltage generation unit 110 illustrated in FIG. 2. The internal reference voltage generation unit 110 may include a voltage divider 111 and a level selector 112. The voltage divider 111 may include a plurality of unit resistors Ru. The plurality of unit resistors Ru may be coupled in series between the power supply voltage VDD and the ground voltage VSS. The voltage divider 111 may output voltages having different levels through nodes coupled to the respective unit resistors Ru. The voltage divider 111 may output the normal voltage VD, the up voltage UVD, and the down voltage DVD through first to third division nodes ND1 to ND3, respectively. The normal voltage VD may be outputted from the first division node ND1. The normal voltage VD may have a voltage level corresponding to a half of the level of the power supply voltage VDD. The normal voltage VD may have substantially the same voltage level as the first reference voltage VREFEX. The up voltage UVD may be outputted from the second division node ND2. The up voltage UVD may have a voltage level. The up voltage UVD may have a voltage level that is higher by a voltage level divided through one unit resistor than the normal voltage VD. The down voltage DVD may be outputted from the third division node ND3. The down voltage DVD may have a voltage level which is lower by a voltage level divided through one unit resistor than the normal voltage VD.

The level selector 112 may provide one of the normal voltage VD, the up voltage UVD, or the down voltage DVD as the second reference voltage VREFINT in response to the output signal OUT. For example, the level selector 112 may provide the normal voltage VD as the second reference voltage VREFINT when the output signal OUT is in a high impedance state. For example, the level selector 112 may provide the up voltage UVD as the second reference voltage VREFINT when the output signal OUT is at a high level. For example, the level selector 112 may provide the down voltage DVD as the second reference voltage VREFINT when the output signal OUT is at a low level.

Figure 4A:
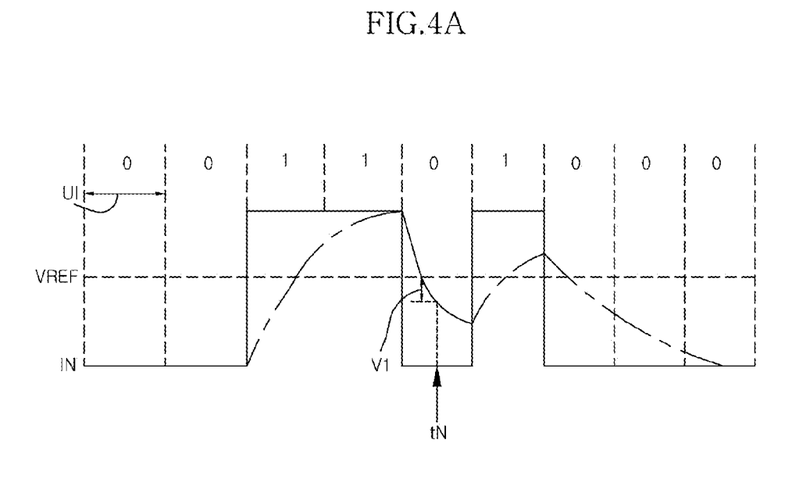
FIG. 4A is a diagram illustrating a representation of an example of the operation of a general buffer circuit.
Figure 4B:
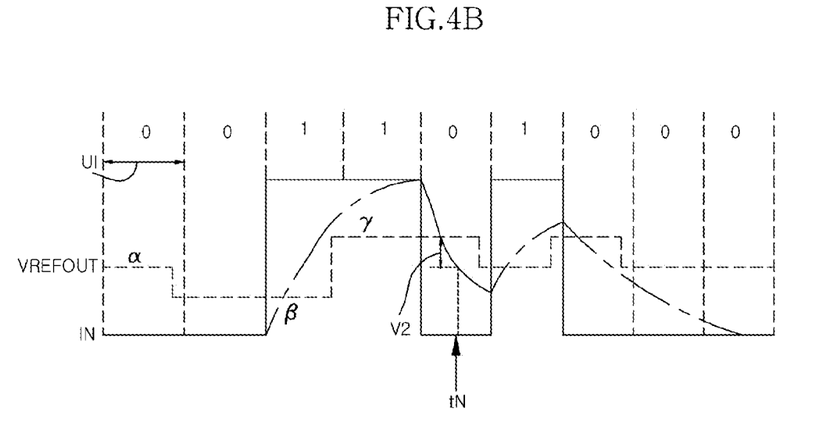
FIG. 4B is a diagram illustrating a representation of an example of the operation of the buffer circuit according to an embodiment.

FIG. 4A is a diagram illustrating a representation of an example of the operation of a general buffer circuit. FIG. 4B is a diagram illustrating a representation of an example of the operation of the buffer circuit 1 according to an embodiment. In FIGS. 4A and 4B, "0" may represent a logic low level, and "1" may represent a logic high level. Referring to FIGS. 1 to 4B, the operation of the buffer circuit 1 according to an embodiment may be described as follows. In FIG. 4A, a solid line may indicate an ideal level change of the input signal IN. In FIG. 4A, an alternate long and short dash line may indicate an actual level change of the input signal IN depending on an offset of the buffer circuit. In FIG. 4A, a broken line may indicate the reference voltage VREF having a fixed level. The general buffer circuit may differentially amplify the input signal IN and the reference voltage VREF having a constant level regardless of the level of the output signal OUT. When the buffer circuit receives the input signal IN which alternately changes between a low level and a high level, the input signal IN which is actually received by the buffer circuit inevitably has a considerably lower level than in the ideal case, as illustrated in FIG. 4A. At a specific time tN, a difference V1 between the input signal IN received by the buffer circuit and the voltage level of the reference voltage VREF may become relatively small. Thus, the time at which the buffer circuit senses and amplifies the input signal IN may be delayed. Furthermore, the amplification operation may not be precisely performed.

Referring to FIG. 4B, a solid line may indicate an ideal level change of the input signal IN. In FIG. 4B, an alternate long and short dash line may indicate an actual level change of the input signal IN. In FIG. 4B, a broken line may indicate a level change of the reference amplification voltage VREFOUT. The buffer circuit 1 according to an embodiment may differentially amplify the input signal IN and the amplification reference voltage VREFOUT having a level which changes in response to the output signal OUT. The ideal level change and the actual level change of the input signal IN may be the same as illustrated in FIG. 4A. However, the level of the amplification reference voltage VREFOUT may change at the time at which the output signal OUT is generated. The time during which the buffer circuit receives a specific input signal IN and generates an output signal OUT corresponding to the specific input signal may be shorter than a unit interval UI. At the initial stage, when the output signal OUT is not generated, the amplification reference voltage VREFOUT may maintain a level α corresponding to the normal voltage VD. When a low-level output signal OUT is generated by an input signal IN applied at a first unit interval UI, the level of the amplification reference voltage VREFOUT may change to a level β corresponding to the down voltage DVD. When a high-level output signal OUT is generated by an input signal IN applied at a third unit interval UI, the level of the amplification reference voltage VREFOUT may change to a level γ corresponding to the up voltage UVD. Thus, a voltage level difference V2 between the input signal IN and the amplification reference voltage VREFOUT at the same specific time tN as FIG. 4A may be larger than in the example of FIG. 4A. Thus, since the time at which the buffer circuit 1 senses and amplifies the input signal IN is advanced, the buffer circuit 1 may perform a precise amplification operation.

Figure 5:
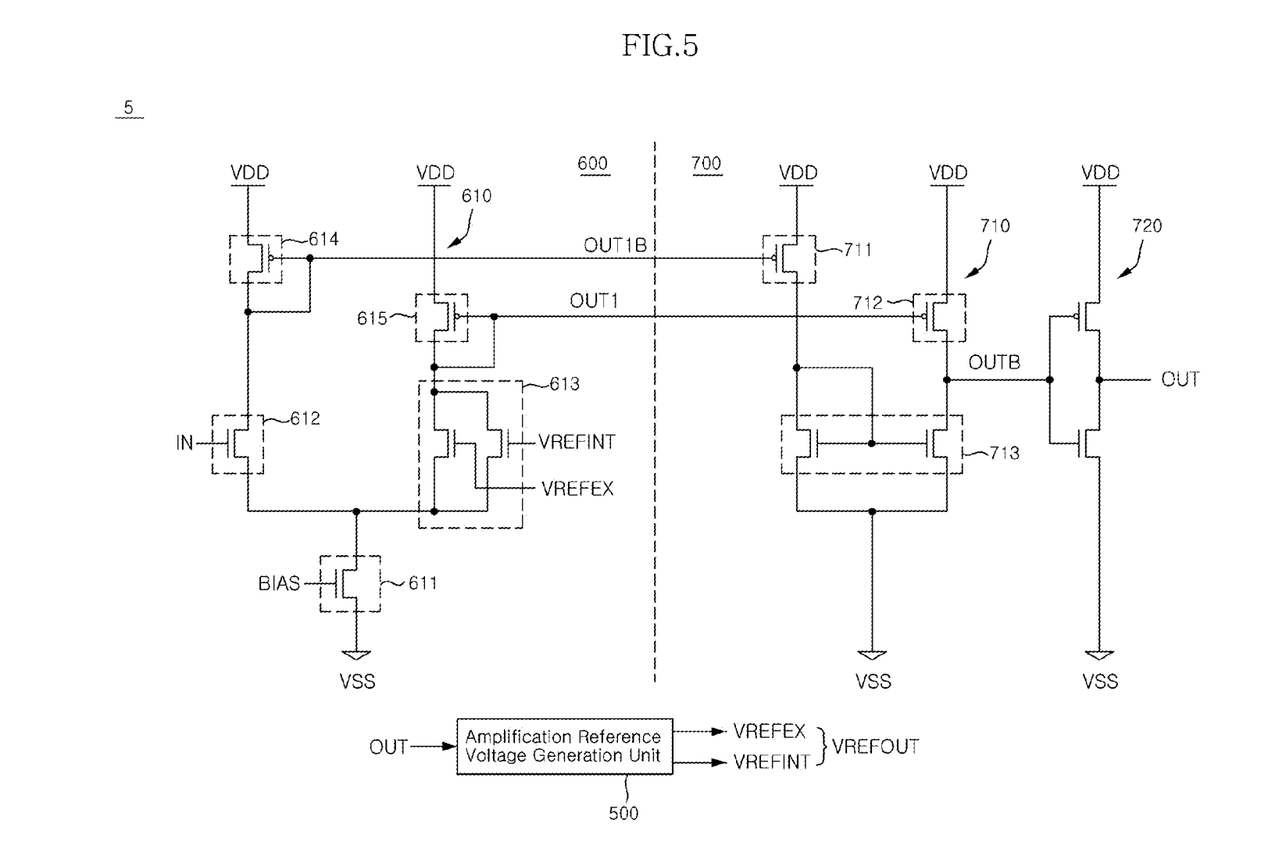
FIG. 5 is a diagram illustrating a representation of an example of the configuration of a buffer circuit according to an embodiment.

FIG. 5 is a diagram illustrating a representation of an example of the configuration of a buffer circuit 5 according to an embodiment. Referring to FIG. 5, the buffer circuit 5 may include an amplification reference voltage generation unit 500, a first amplification stage 600, and a second amplification stage 700. The amplification reference voltage generation unit 500 may have substantially the same configuration as the amplification reference voltage generation unit 100 of FIG. 1. The amplification reference voltage generation unit 500 may receive an output signal OUT. The amplification reference voltage generation unit 500 may generate an amplification reference voltage VREFOUT. The amplification reference voltage VREFOUT may include first and second reference voltages VREFEX and VREFINT. The amplification reference voltage generation unit 500 may generate the first reference voltage VREFEX from an external reference voltage, and may generate the second reference voltage VREFIN having a level. The level of the second reference voltage VREFIN may change according to a level change of the output signal OUT.

The first amplification stage 600 may differentially amplify the input signal IN and the amplification reference voltage VREFOUT. The first amplification stage 600 may generate a first amplified signal pair OUT1 and OUT1B. The first amplification stage 600 may include a first amplification unit 610. The first amplification unit 610 may have substantially the same configuration as the amplification unit 200 of FIG. 1, except for the load units. The first amplification unit 610 may include an enable unit 611, a first input unit 612, and a second input unit 613. The first amplification unit 610 may include a first load unit 614 and a second load unit 615. The enable unit 611 may enable the first amplification unit 610 in response to a bias signal BIAS. The enable unit 611 may be coupled between the first and second input units 612 and 613 and a ground voltage VSS. The first input unit 612 may receive the input signal IN and may form a current path. The first input unit 612 may be coupled between the first load unit 614 and the enable unit 611. The first amplified signal OUT1B may be generated from a node between the first input unit 612 and the first load unit 614. The second input unit 613 may receive the first and second reference voltages VREFEX and VREFINT and form a current path. The second input unit 613 may be coupled between the second load unit 615 and the enable unit 611. The first amplified signal OUT1 may be generated from a node between the second input unit 613 and the second load unit 615. The first load unit 614 may include a transistor coupled between the power supply voltage VDD and the first input unit 612. The first load unit 614 may be configured to receive the first amplified signal OUT1B. The second load unit 615 may include a transistor coupled between the power supply voltage VDD and the second input unit 613. The second load unit 615 may be configured to receive the first amplified signal OUT1.

The second amplification stage 700 may differentially amplify the first amplified signal pair OUT1 and OUT1B, and generate the output signal OUT. The second amplification stage 700 may include a second amplification unit 710 and a slicer 720. The second amplification unit 710 may include a third input unit 711, a fourth input unit 712, and a current mirror 713. The third input unit 711 may receive the first amplified signal OUT1B. The third input unit 711 may form a current path between the power supply voltage VDD and the current mirror 713. The fourth input unit 712 may receive the first amplified signal OUT1. The fourth input unit 712 may form a current path between the power supply voltage VDD and the current mirror 713. The current mirror 713 may be coupled between the third and fourth input units 711 and 712 and the ground voltage VSS. The inverted signal OUTB of the output signal OUT may be outputted from a node between the fourth input unit 712 and the current mirror 713. The slicer 720 may receive the inverted signal OUTB of the output signal and generate the output signal OUT. The slicer 720 may be coupled between the node between the fourth input unit 712 and the current mirror 713, the power supply voltage VDD, and the ground voltage VSS.

The buffer circuit 5 may compare and amplify the amplification reference voltage VREFOUT having a level. The level of the amplification reference voltage VREFOUT may change according to the input signal IN and the output signal OUT, that is, the first and second reference voltages VREFEX and VREFINT, at the first amplification stage 600. The buffer circuit 5 may secure a sufficient voltage level difference between the input signal IN and the amplification reference voltage VREFOUT. Therefore, the entire gain of the buffer circuit 5 may be increased, and the operating speed of the buffer circuit 5 may be improved.

The buffer circuit discussed above (see FIGS. 1-3 and 4B-5) are particular useful in the design of memory devices, processors, and computer systems. For example, referring to FIG. 6, a block diagram of a system employing the buffer circuit in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 6:
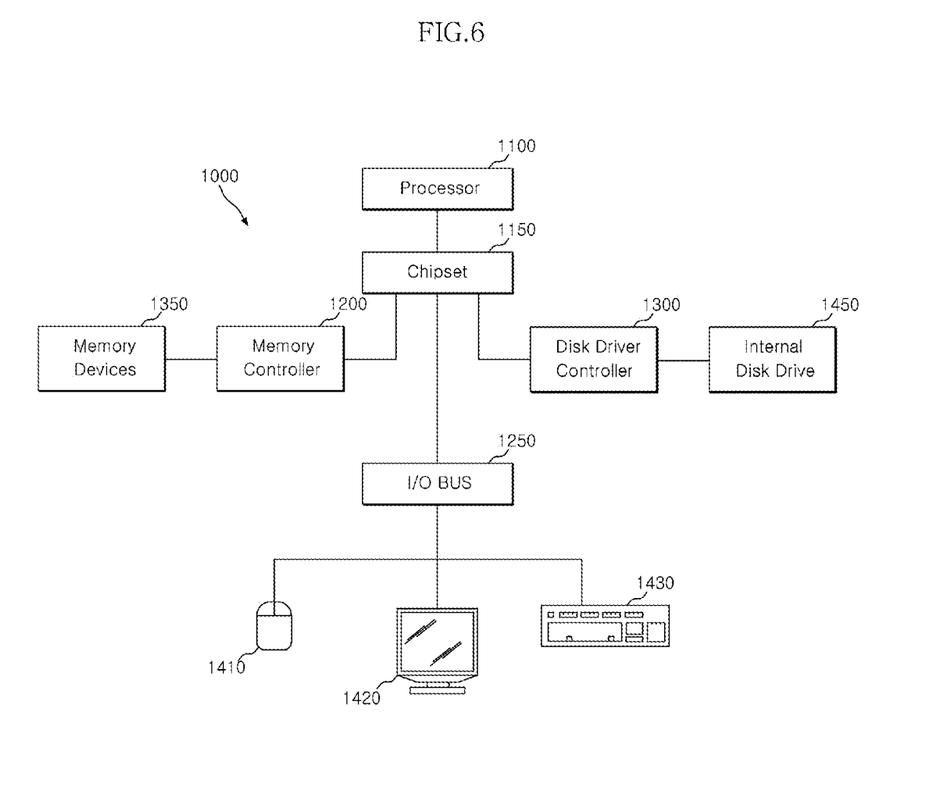
FIG. 6 illustrates a block diagram of an example of a representation of a system employing the buffer circuit in accordance with the various embodiments discussed above with relation to FIGS. 1-3 and 4B-5.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one buffer circuit as discussed above with reference to FIGS. 1-3 and 4B-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one buffer circuit as discussed above with relation to FIGS. 1-3 and 4B-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the buffer circuit as discussed above with relation to FIGS. 1-3 and 4B-5. In alternate embodiments, such as cellular phones or digital cameras, the components may differ from the embodiments illustrated in FIG. 6.

While certain embodiments have been described above, it will be understood to those skilled in the art that the embodiments described are by way of example only. Accordingly, the buffer circuit described herein should not be limited based on the described embodiments. Rather, the buffer circuit described herein should only be limited in light of the claims that follow when taken in conjunction with the above description and accompanying drawings.

What is claimed is:

1. A buffer circuit comprising:
   an amplification reference voltage generation unit configured to receive an output signal, generate an amplification reference voltage, and to change a level of the amplification reference voltage based on a level of the output signal; and
   an amplification unit configured to generate the output signal by differentially amplifying an input signal and the amplification reference voltage.

2. The buffer circuit according to claim 1, wherein the amplification reference voltage generation unit raises the level of the amplification reference voltage when the output signal is at a high level, and lowers the level of the amplification reference voltage when the output signal is at a low level.

3. The buffer circuit according to claim 1,
   wherein the amplification reference voltage comprises a first reference voltage having a fixed level and a second reference voltage having a level, and
   wherein the level of the second reference voltage changes according to the output signal.

4. The buffer circuit according to claim 3, wherein the first reference voltage comprises an external reference voltage received from outside a semiconductor device including the buffer circuit provided therein.

5. The buffer circuit according to claim 3, wherein the amplification reference voltage generation unit comprises an internal reference voltage generation unit configured to output one of a normal voltage, an up voltage having a higher level than the normal voltage, or a down voltage having a lower level than the normal voltage, as the second reference voltage, in response to the output signal.

6. The buffer circuit according to claim 3, wherein the amplification unit comprises:
   an enable unit configured to form a current path in response to a bias signal;
   a first input unit configured to receive the input signal, and form a current path according to the level of the input signal; and
   a second input unit configured to receive the amplification reference voltage, and form a current path according to the level of the amplification reference voltage.

7. The buffer circuit according to claim 6, wherein the second input unit comprises:
   a first current path formation unit configured to receive the first reference voltage, and form a current path of the second input unit; and
   a second current path formation unit configured to receive the second reference voltage, and form a current path of the second input unit.

8. A buffer circuit comprising:
   an amplification reference voltage generation unit configured to generate a first reference voltage having a fixed level and a second reference voltage having a variable level changing according to a level of an output signal;
   a first input unit configured to receive an input signal and form a current path between a power supply voltage and a ground voltage; and
   a second input unit configured to receive the first and second reference voltages and form a current path between the power supply voltage and the ground voltage, and coupled to an output node.

9. The buffer circuit according to claim 8, wherein the first reference voltage comprises an external reference voltage received from outside a semiconductor device having the buffer circuit provided therein.

10. The buffer circuit according to claim 8, wherein the amplification reference voltage generation unit raises the level of the second reference voltage when the output signal is at a high level, and lowers the level of the second reference voltage when the output signal is at a low level.

11. The buffer circuit according to claim 8, wherein the amplification reference voltage generation unit comprises an internal reference voltage generation unit configured to output one of a normal voltage, an up voltage having a higher level than the normal voltage, or a down voltage having a lower level than the normal voltage, as the second reference voltage, in response to the output signal.

12. The buffer circuit according to claim 8, wherein the second input unit comprises:
   a first current path formation unit configured to receive the first reference voltage and form a current path between the output node and the ground voltage; and
   a second current path formation unit configured to receive the second reference voltage and form a current path between the output node and the ground voltage.

13. The buffer circuit according to claim 12,
   wherein the first current path formation unit includes a transistor having a drain coupled to the output node, a gate configured to receive the first reference voltage, and a source coupled to the ground voltage, and
   wherein the second current path formation unit includes a transistor having a drain coupled to the output node, a gate configured to receive the second reference voltage, and a source coupled to the ground voltage.

14. A buffer circuit comprising:
   an amplification reference voltage generation unit configured to receive an output signal, generate an amplification reference voltage, and to change a level of the amplification reference voltage based on a level of the output signal;
   a first amplification stage configured to generate a first amplified signal pair by differentially amplifying an input signal and the amplification reference voltage; and
   a second amplification stage configured to generate the output signal by differentially amplifying the first amplified signal pair.

15. The buffer circuit according to claim 14, wherein the amplification reference voltage generation unit raises the level of the amplification reference voltage when the output signal is at a high level, and lowers the level of the amplification reference voltage when the output signal is at a low level.

16. The buffer circuit according to claim 14, wherein the amplification reference voltage comprises a first reference voltage having a fixed level and a second reference voltage level having a level, and
   wherein the level of the second reference voltage changes according to the output signal.

17. The buffer circuit according to claim 16, wherein the first reference voltage comprises an external reference voltage received from outside a semiconductor device having the buffer circuit provided therein.

18. The buffer circuit according to claim 16, wherein the amplification reference voltage generation unit comprises an internal reference voltage generation unit configured to output one of a normal voltage, an up voltage having a higher level than the normal voltage, or a down voltage having a lower level than the normal voltage, as the second reference voltage, in response to the output signal.

19. The buffer circuit according to claim 14, wherein the first amplification stage comprises:
- an enable unit configured to form a current path in response to a bias signal;
- a first input unit configured to receive the input signal and form a current path according to the level of the input signal; and
- a second input unit configured to receive the amplification reference voltage and form a current path according to the level of the amplification reference voltage.

20. The buffer circuit according to claim 19, wherein the second input unit comprises:
- a first current path formation unit configured to receive the first reference voltage and form a current path of the second input unit; and
- a second current path formation unit configured to receive the second reference voltage and form a current path of the second input unit.

* * * * *